United States Patent
Hsu et al.

(10) Patent No.: US 9,416,297 B2
(45) Date of Patent: Aug. 16, 2016

(54) CHEMICAL MECHANICAL POLISHING METHOD USING SLURRY COMPOSITION CONTAINING N-OXIDE COMPOUND

(71) Applicants: Taiwan Semiconductor Manufacturing Co., Ltd., Hsin-Chu (TW); UWiZ Technology Co., Ltd., Zhongli (TW)

(72) Inventors: Chia-Jung Hsu, Dacheng Township (TW); Yun-Lung Ho, Miaoli (TW); Neng-Kuo Chen, Sinshih Township (TW); Wen-Feng Chueh, Tainan (TW); Sey-Ping Sun, Hsinchu (TW); Song-Yuan Chang, Minxiong Township (TW)

(73) Assignees: Taiwan Semiconductor Manufacturing Co., Ltd., Hsin-Chu (TW); UWiZ Technology Co., Ltd., Zhongli (TW)

( * ) Notice: Subject to any disclaimer, the term of this patent is extended or adjusted under 35 U.S.C. 154(b) by 0 days.

(21) Appl. No.: 14/078,797

(22) Filed: Nov. 13, 2013

(65) Prior Publication Data

US 2015/0129795 A1    May 14, 2015

(51) Int. Cl.
*C09G 1/02* (2006.01)
*C09G 1/04* (2006.01)

(52) U.S. Cl.
CPC ... *C09G 1/02* (2013.01); *C09G 1/04* (2013.01)

(58) Field of Classification Search
CPC ..... C09G 1/04; C09K 3/1463; H01L 21/3212
USPC .......................................... 252/79.1; 510/175
See application file for complete search history.

(56) References Cited

U.S. PATENT DOCUMENTS

| | | | | |
|---|---|---|---|---|
| 6,083,419 | A * | 7/2000 | Grumbine | C09G 1/02 216/88 |
| 2004/0007690 | A1 * | 1/2004 | Snider | B24B 19/226 252/79.1 |
| 2004/0030197 | A1 * | 2/2004 | Maleczka et al. | 568/800 |
| 2005/0233578 | A1 * | 10/2005 | Jia et al. | 438/633 |
| 2007/0219104 | A1 * | 9/2007 | Grumbine et al. | 510/175 |
| 2008/0209104 | A1 * | 8/2008 | Tanaka et al. | 711/100 |
| 2008/0315154 | A1 * | 12/2008 | Kollodge | 252/79.1 |
| 2011/0186542 | A1 * | 8/2011 | Li et al. | 216/13 |
| 2012/0190200 | A1 * | 7/2012 | Penta et al. | 438/692 |

FOREIGN PATENT DOCUMENTS

WO    2010039936 A2    4/2010

\* cited by examiner

*Primary Examiner* — Shamim Ahmed
(74) *Attorney, Agent, or Firm* — Eschweiler & Associates, LLC

(57) ABSTRACT

The present disclosure relates to a chemical mechanical polishing (CMP) slurry composition that provides for a high metal to dielectric material selectivity along with a low rate of metal recess formation. In some embodiments, the disclosed slurry composition has an oxidant and an etching inhibitor. The oxidant has a compound with one or more oxygen molecules. The etching inhibitor has a nitrogen-oxide compound. The etching inhibitor reduces the rate of metal and dielectric material (e.g., oxide) removal, but does so in a manner that reduces the rate of dielectric material removal by a larger amount, so as to provide the slurry composition with a high metal (e.g., germanium) to dielectric material removal selectivity and with a low rate of metal recess formation.

20 Claims, 7 Drawing Sheets

| | Etching inhibitor | Oxidant | Ge R.R. (A/min) | Oxide R.R. (A/min) | Ge/Oxide selectivity | Recess (Å) |
|---|---|---|---|---|---|---|
| 1 | None | Hydrogen peroxide | 2200 | 80 | 27.5 | 835 |
| 2 | 2-mercaptopyridine N-oxide | Hydrogen peroxide | 1845 | 28 | 65 | 100 |
| 3 | 4-methylpyridine N-oxide | Ammonium peroxodisulfate | 1245 | 15 | 83 | 35 |
| 4 | N-methylmorpholine N-oxide | tert-butyl hydrogen peroxide | 1856 | 21 | 88 | 48 |
| 5 | N-methylmorpholine N-oxide* | tert-butyl hydrogen peroxide | 656 | 3 | 218 | 25 |

* abrasive free

Fig. 8 details are set forth in order to facilitate understanding. It will be appreciated that the details of the figures are not intended to limit the disclosure, but rather are non-limiting embodiments. For example, it may be evident, however, to one of ordinary skill in the art, that one or more aspects described herein may be practiced with a lesser degree of these specific details. In other instances, known structures and devices are shown in block diagram form to facilitate understanding.

CHEMICAL MECHANICAL POLISHING METHOD USING SLURRY COMPOSITION CONTAINING N-OXIDE COMPOUND

BACKGROUND

Integrated chips are constructed using complex fabrication processes that form a plurality of different layers on top of one another. Many of the different layers are patterned using photolithography, a process by which a photoresist material is selectively exposed to electromagnetic radiation. For example, photolithography may be used to define back-end-of-the-line metallization layers that are formed on top of one another. To ensure that the metallization layers are formed with a good structural definition, the electromagnetic radiation must be properly focused. To properly focus electromagnetic radiation, a workpiece must be substantially planar to avoid depth of focus problems.

Chemical mechanical polishing (CMP) is a widely used process by which both chemical and mechanical forces are used to globally planarize a semiconductor workpiece. The planarization prepares the workpiece for the formation of a subsequent layer. A typical CMP system comprises a rotating platen covered by a polishing pad. A slurry distribution system is configured to provide a chemical mechanical polishing slurry to the polishing pad. A workpiece is then brought into contact with the pad, causing the rotating platen to planarize the workpiece.

BRIEF DESCRIPTION OF THE DRAWINGS

FIG. 8 is a chart showing some embodiments of a disclosed slurry with an etching inhibitor.

DETAILED DESCRIPTION

Figure 1:
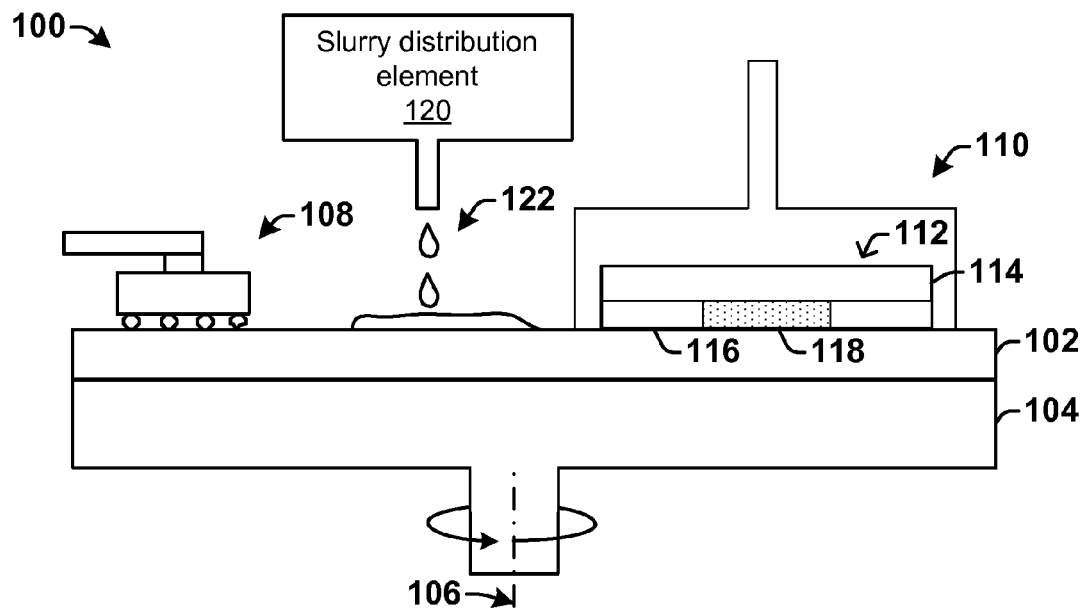
FIG. 1 illustrates some embodiments of a semiconductor substrate within a chemical mechanical polishing (CMP) system having a slurry distribution element configured to provide a slurry having an etching inhibitor.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It will be appreciated that the details of the figures are not intended to limit the disclosure, but rather are non-limiting embodiments. For example, it may be evident, however, to one of ordinary skill in the art, that one or more aspects described herein may be practiced with a lesser degree of these specific details. In other instances, known structures and devices are shown in block diagram form to facilitate understanding.

Germanium has been widely studied as a means to improve the performance of integrated chips because it offers a high electron mobility. One application of germanium in modern integrated chip design is in fin field effect transistor (finFET). To develop a silicon-germanium (SiGe) finFET, a chemical mechanical polishing (CMP) process may be used to remove excess germanium from a surface of a substrate.

Typical CMP processes performed during the formation of a SiGe finFET may use a slurry comprising hydrogen peroxide. Such a slurry can give a high germanium to oxide removal selectivity that acts to remove excess germanium without removing oxide. However, such a slurry also forms recesses within the germanium channel regions of the finFET device. Such recesses make the resulting thickness of the germanium channel regions, causing poor device performance. Therefore, a CMP process that uses a slurry having a high germanium to oxide removal selectivity and a low rate of germanium recess formation is desirable to achieve good device performance.

Accordingly, the present disclosure relates to a chemical mechanical polishing (CMP) slurry composition that provides for a high metal to dielectric material selectivity along with a low rate of metal recess formation. In some embodiments, the disclosed slurry composition comprises an oxidant and an etching inhibitor. The oxidant comprises a compound having one or more oxygen molecules. The etching inhibitor comprises a nitrogen-oxide compound. The etching inhibitor reduces the rate of metal and dielectric material removal, but does so in a manner that reduces the rate of dielectric material (e.g., oxide) removal by a larger amount, so as to provide the slurry composition with a high metal (e.g., germanium) to dielectric material (e.g., oxide) removal selectivity and with a low rate of metal recess formation.

FIG. 1 illustrates a side view of some embodiments of a chemical mechanical polishing (CMP) tool 100 having a slurry distribution element 120 configured to distribute a slurry 122 that achieves a chemical mechanical polishing (CMP) process with a high metal to dielectric material removal selectivity (i.e., a ratio of an amount of metal removed to an amount of dielectric material removed) and a low rate of metal recess formation.

The CMP tool 100 comprises a polishing pad 102 configured to perform polishing of a semiconductor substrate 112. The polishing pad 102 is located on a platen 104, which rotates the polishing pad 102 about an axis of rotation 106 during operation of the CMP tool 100. A pad conditioning element 108, comprising a diamond grit conditioning pad, is configured to push on the polishing pad 102 with a downward force that brings the plurality of diamond particles into contact with the polishing pad 102. As the polishing pad 102 is rotated by the platen 104, the diamond particles roughen the surface of the polishing pad 102 to provide for improved mechanical polishing.

The CMP tool 100 further comprises a workpiece carrier 110. The workpiece carrier 110 is configured to house the semiconductor substrate 112 in an upside down position so that a top surface of the semiconductor substrate 112 faces the rotating polishing pad 102. The workpiece carrier 110 is operable to bring the semiconductor substrate 112 into contact with the rotating polishing pad 102. By bringing the semiconductor substrate 112 into contact with the rotating polishing pad 102, polishing of the semiconductor substrate 112 is performed.

The semiconductor substrate 112 comprises a semiconductor body 114 as well as an overlying dielectric material layer 116 (e.g., oxide) and an overlying metal layer 118. In some embodiments, the semiconductor body 114 may comprise silicon, germanium, a III-V semiconductor material (i.e., comprising a combination of one or more group III elements with one or more group V elements), or some other semiconductor material. The dielectric material layer 116 and the metal layer 118 share a common interface that faces the rotating polishing pad 102. In some embodiments, the metal layer 118 may comprise germanium, while in other embodiments, the metal layer 118 may comprise other metals (e.g., copper, aluminum, etc.). In some embodiments, the dielectric material layer 116 may comprise silicon dioxide, while in other embodiments, the dielectric material layer 116 may comprise other dielectric materials (e.g., SiCO).

A slurry distribution element 120 is configured to deposit a chemical mechanical polishing slurry 122 onto the polishing pad 102. The chemical mechanical polishing slurry 122 comprises an oxidant and an etching inhibitor. The oxidant comprises a compound having one or more oxygen molecules (e.g., hydrogen peroxide, potassium peroxydisulfate, etc.). The etching inhibitor comprises a nitrogen-oxide compound. The nitrogen oxide compound may have a chemical formula of $R1R2R3N^+$—$O^-$, wherein R1 is a first substituent, R2 is a second substituent, and R3 is a third substituent. The nitrogen-oxide compound reduces the rate of metal and dielectric material (e.g., oxide) removal, but does so in a manner that reduces the rate of dielectric material removal by a larger amount, so that the slurry 122 provides for a CMP process having a high metal (e.g., germanium) to dielectric material removal selectivity and with a low rate of metal recess formation. In other words, the slurry 122 provides for a CMP process that removes a greater thickness of the metal layer 118 than the dielectric material layer 116, while causing a low recess in the metal layer 118. In some embodiments, the disclosed slurry 122 may provide for a removal of the metal layer 118 and the dielectric material layer 116 having a selectivity that is greater than or equal to 30 (i.e., removed metal thickness/removed dielectric material thickness>30).

It will be appreciated that in some embodiments the disclosed slurry 122 may comprise additional components. For example, the slurry 122 may comprise a surfactant (e.g., polyethylene glycol) configured to lower the surface tension of the slurry 122. In other embodiments, the slurry may comprise abrasive particles that are used in mechanical polishing of the semiconductor substrate. For example, the slurry 122 may comprise abrasive particles comprising colloidal silica, fumed silica, aluminum oxide, silica shell based composite submicron particles. In other embodiments, the slurry 122 may be abrasive free (i.e., the slurry 122 does not comprise abrasive particles).

Figure 2:
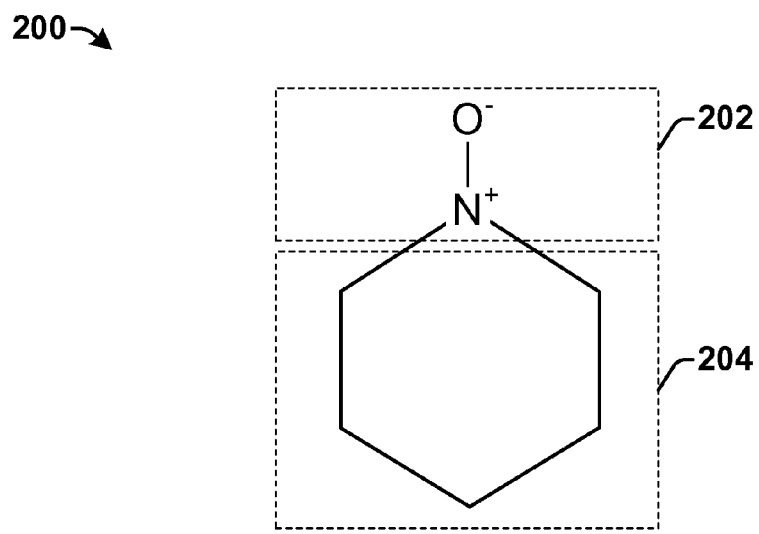
FIG. 2 illustrates some embodiments of a structure of a disclosed slurry with an etching inhibitor comprising a nitrogen-oxide compound.

FIG. 2 illustrates some embodiments of a chemical structure 200 of a disclosed slurry with an etching inhibitor 202 comprising a nitrogen-oxide compound.

As illustrated by chemical structure 200, the slurry comprises an etching inhibitor 202 and an oxidant 204. The oxidant 204 comprises one or more oxygen molecules. In various embodiments, the oxidant 204 may comprise hydrogen peroxide, potassium peroxydisulfate, ammonium peroxydisulfate, sodium peroxydisulfate, potassium peroxymonosulfate, peracetic acid, or tert-butyl hydrogen peroxide, for example.

The etching inhibitor 202 comprises a nitrogen-oxide compound having the chemical formula of $R1R2R3N^+$—$O^-$, wherein R1 is a first substituent, R2 is a second substituent, and R3 is a third substituent. In some embodiments, the nitrogen-oxide compound comprises a nitrogen (N) molecule bonded to an oxygen (O) molecule. In some embodiments, the etching inhibitor 202 may comprise first and second substituents, R1 and R2, comprising a chain of between approximately 1 and 20 carbon alkyl substituents and a third substituent R3 comprising a chain of between approximately 1 and 10 carbon alkyl substituents. In some embodiments, the alkyl substituent may be disposed within parent chains, while in other embodiments the alkyl substituent may be disposed within side chains, which are carbon chains that are not in the parent chain, but are branched off from it. In yet other embodiments, the alkyl substituent may comprise cyclic substituents.

In some embodiments, the etching inhibitor 202 may comprise pyridine N-oxide, 2,2,6,6-Tetramethylpiperidine-1-oxyl (TEMPO), 4-methylpyridine N-oxide, N-methylmorpholine N-oxide, 5,5-dimethyl-1-pyrroline N-oxide, trimethylamine N-oxide; quinoline N-oxide, or 2-mercaptopyridine N-oxide, for example.

The slurry may comprise a concentration of the oxidant 204 that is in a range of between approximately 10 ppm (parts per million) and 50,000 ppm and a concentration of the etching inhibitor 202 that is in a range of between approximately 1 ppm (parts per million) and 10,000 ppm. The slurry may further comprise a pH level having a range of between approximately 1 and approximately 10. For example, in one embodiment a slurry composition may comprise 1,000 ppm colloidal silica, 8,000 ppm hydrogen peroxide ($H_2O_2$), 300 ppm 2-mercaptopyridine N-oxide, and have a pH level of 6. In such an embodiment, the 2-mercaptopyridine will be formed as a passive film onto a metal (e.g., germanium) surface. The slurry composition then operates to enable a chemical mechanical polishing that provides for a germanium removal rate of approximately 365 angstroms/min.

Figure 3:
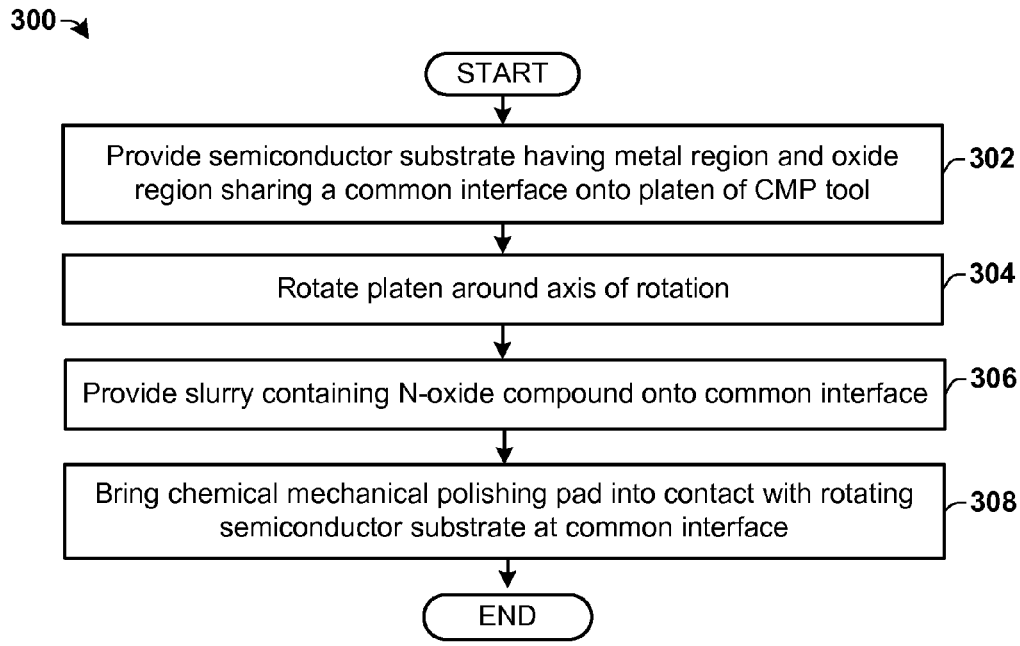
FIG. 3 illustrates a flow chart of some embodiments of a method of performing a chemical mechanical polishing process with a high metal to oxide removal selectivity and a low rate of metal recess formation.

FIG. 3 illustrates a flow chart of some embodiments of a method 300 of performing a chemical mechanical polishing process with a high metal to oxide removal selectivity and a low rate of metal recess formation.

While the disclosed methods (e.g., methods 300 and 600) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 302, a semiconductor substrate is provided onto a platen of a chemical mechanical polishing (CMP) tool. The semiconductor substrate comprises a metal region and an oxide region sharing a common interface. For example, the metal region and the oxide region may comprise adjacent regions on a top surface of a semiconductor substrate. In some embodiments, the metal region may comprise germanium.

At 304, the platen is rotated around an axis of rotation. Rotation of the platen causes the semiconductor substrate to rotate around the axis of rotation.

At 306, a slurry comprising an oxidant and an etching inhibitor having a nitrogen-oxide (N-oxide) compound is provided onto the common interface.

Figure 4:
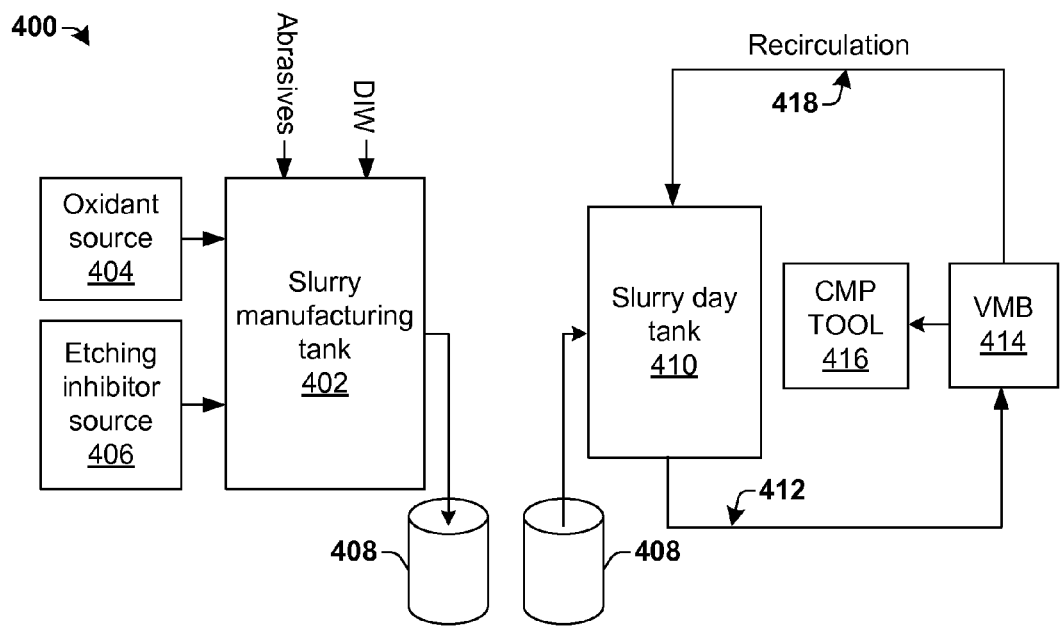
FIG. 4 illustrates some additional embodiments of a disclosed chemical mechanical polishing slurry manufacturing and delivery system.

At 308, a chemical mechanical polishing pad is brought into contact with the rotating semiconductor substrate. Upon being brought into contact with the polishing pad, the semiconductor substrate is polishing, thereby removing excess metal from semiconductor substrate. Since the slurry, which comprises an etching inhibitor, is used in the polishing process the chemical mechanical polishing process is performed with a high metal to oxide removal selectivity and a low rate of metal recess formation FIG. 4 illustrates some additional embodiments of a disclosed chemical mechanical polishing slurry manufacturing and delivery system 400.

The chemical mechanical polishing slurry manufacturing and delivery system 400 comprises a slurry manufacturing tank 402 configured to manufacture slurry, which is then packaged into a slurry container 408. The slurry manufacturing tank 402 is connected to an oxidant source 404 and to an etching inhibitor source 406. The oxidant source 404 is configured to provide an oxidant to the slurry manufacturing tank 402. In various embodiments, the oxidant may comprise hydrogen peroxide, potassium peroxydisulfate, ammonium peroxydisulfate, sodium peroxydisulfate, potassium peroxymonosulfate, peracetic acid, or tert-butyl hydrogen peroxide.

The etching inhibitor source 406 is configured to provide an etching inhibitor to the slurry manufacturing tank 402, comprising a nitrogen-oxide compound having a chemical formula of $R1R2R3N^+$—$O^-$, wherein R1 is a first substituent, R2 is a second substituent, and R3 is a third substituent. In various embodiments, the substituents, R1-R3, may comprise different chemicals or the same chemicals. For example, the substituents, R1-R3, may comprise chains of carbon alkyl substituent, as described above. In some embodiments, the slurry manufacturing tank 402 may comprise additional inlets configured to provide de-ionized water and/or abrasives to the slurry manufacturing tank 402, which are subsequently introduced into the slurry.

The slurry packaged within the slurry container 408 is configured to be transported into a day tank 410 comprised within a slurry delivery system. In the slurry delivery system, the slurry is provided by way of a transport piping 412 from the day tank 402 to one or more valve manifold boxes 414. The valve manifold boxes 414 are configured to selectively provide the slurry from the transport piping 412 to a chemical mechanical polishing (CMP) tool 416, when the CMP tool 416 is operated to perform a chemical mechanical polishing of a semiconductor substrate.

In some embodiments, a re-circulation transport piping 418 is configured to return slurry that has not been provided to the CMP tool 416 from the one or more valve manifold boxes 414 to the slurry day tank 410. The slurry day tank 410 is configured to mix the unused slurry with new slurry to maintain a slurry having a high metal to oxide selectivity with a low rate of metal recess formation. The nitrogen-oxide compound further increases the life of the slurry within the slurry day tank 410. For example, in some embodiments, the slurry may be reused for at time period of at least six months.

FIGS. 5A-5G illustrate some alternative embodiments of chemical structures of a disclosed slurry with an etching inhibitor comprising a nitrogen-oxide compound.

Figure 5A:
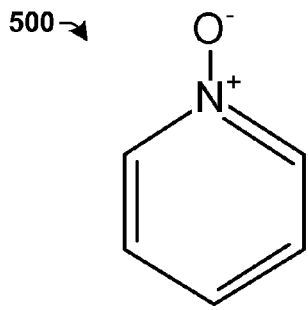
FIGS. 5A-5G illustrates some alternative embodiments of structures of a disclosed slurry with an etching inhibitor comprising a nitrogen-oxide compound.

FIG. 5A illustrates a disclosed slurry comprising pyridine N-oxide compound 500. The pyridine-N-oxide compound 500 is a heterocyclic compound with the formula $C_5H_5NO$ that is a product of the oxidation of pyridine ($C_5H_5N$).

Figure 5B:
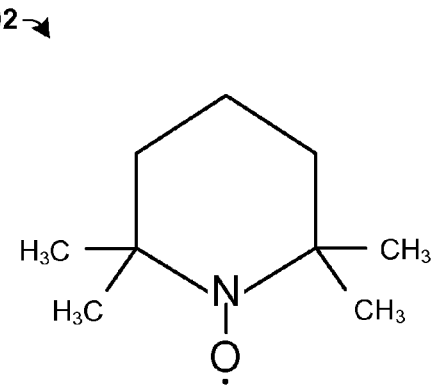

FIG. 5B illustrates a disclosed slurry comprising a 2,2,6, 6-Tetramethylpiperidine-1-oxyl (i.e., TEMPO) compound 502. The 2,2,6,6-Tetramethylpiperidine-1-oxyl compound 502 is a chemical compound with the formula $(CH_2)_3(CMe_2)_2NO$.

Figure 5C:
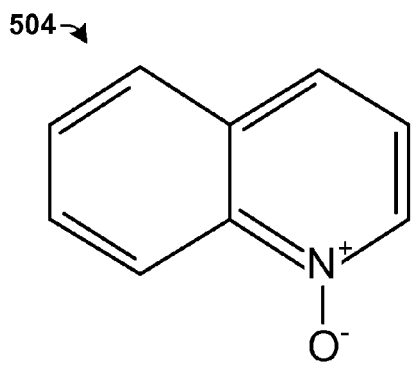

FIG. 5C illustrates a disclosed slurry comprising a N-methylmorpholine N-oxide compound 504. The N-methylmorpholine N-oxide (NMO) compound 504 is a chemical compound with a formula $C_5H_{11}NO_2$.

Figure 5D:
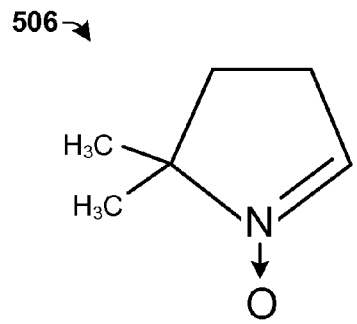

FIG. 5D illustrates a disclosed slurry comprising a 5,5-dimethyl-1-pyrroline N-oxide compound 508. The 5,5-dimethyl-1-pyrroline N-oxide compound 508 is a chemical compound with the formula $C_6H_{11}NO$.

Figure 5E:
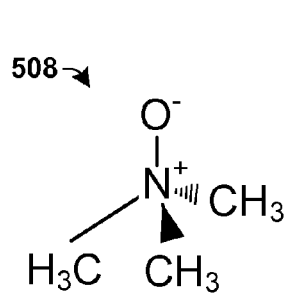

FIG. 5E illustrates a disclosed slurry comprising a trimethylamine N-oxide compound 510. The trimethylamine N-oxide compound 510 is an organic compound with a formula $(CH_3)_3NO$.

Figure 5F:
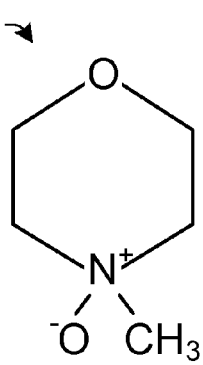
Figure 5G:
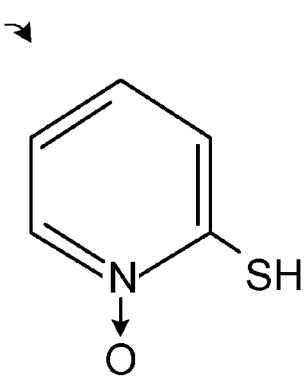
Figure 6:
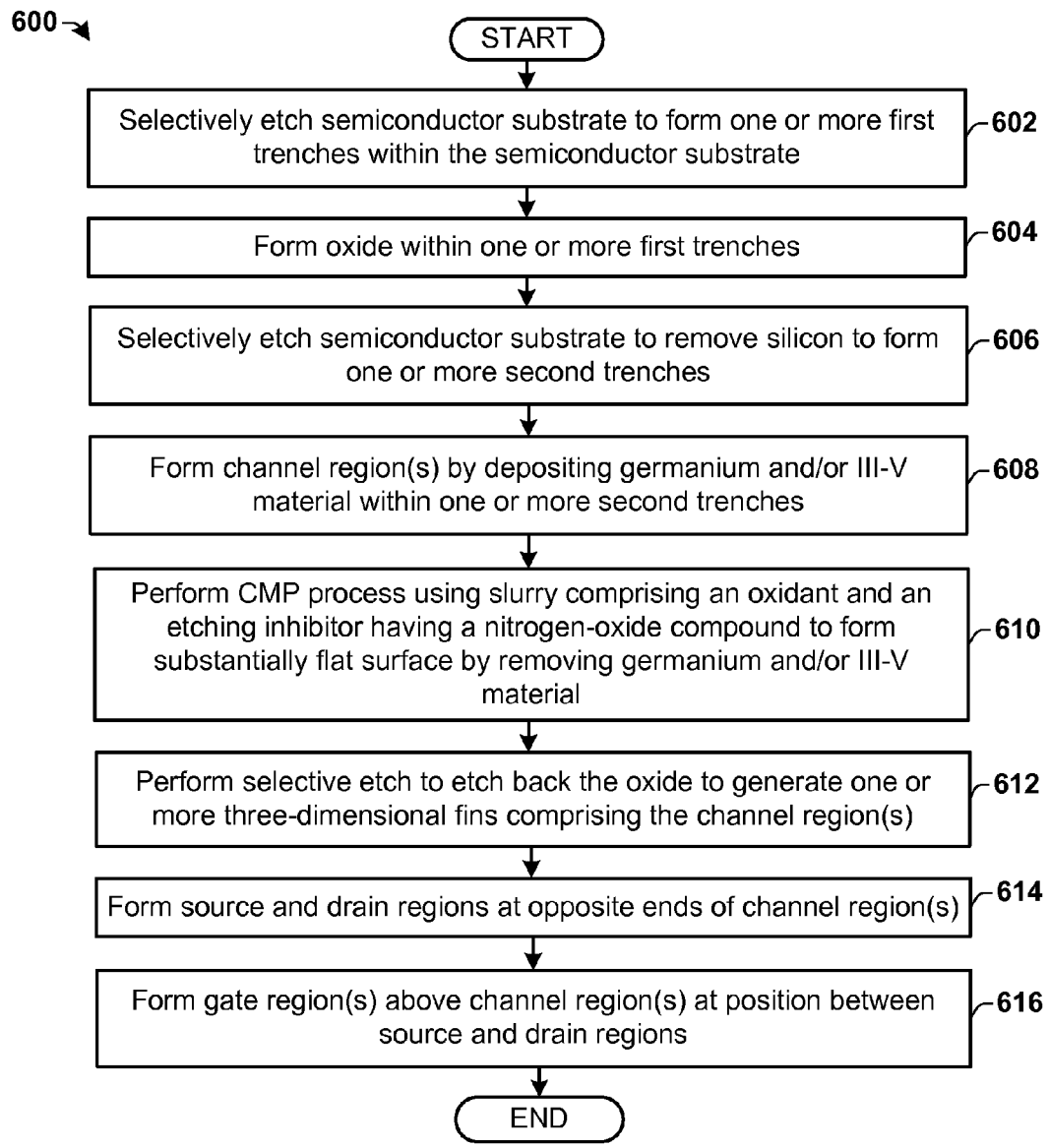
FIG. 6 illustrates a flow chart of some embodiments of a method of forming a silicon germanium fin field effect transistor (FinFET) transistor using a chemical mechanical polishing process with a high germanium to oxide removal selectivity.

FIG. 5F illustrates a disclosed slurry comprising a quinoline N-oxide compound 512. The quinoline N-oxide compound 512 is a chemical compound with the formula $C_9H_7NO.xH_2O$ FIG. 5G illustrates a disclosed slurry comprising a 2-mercaptopyridine N-oxide compound 514. The 2-mercaptopyridine N-oxide compound 514 is a chemical compound with a formula $C_5H_5NOS$ FIG. 6 illustrates a flow chart of some embodiments of a method 600 of forming a silicon germanium (SiGe) fin field effect transistor (FinFET) transistor using a chemical mechanical polishing process with a high germanium to oxide removal selectivity and a low rate of germanium recess formation.

At 602, a semiconductor substrate is selectively etched to form one or more first trenches within the semiconductor substrate. The one or more first trenches are recesses within the semiconductor substrate.

At 604, an oxide is formed in the one or more first trenches.

At 606, the semiconductor substrate is selectively etched to remove silicon to form one or more second trenches. The one or more second trenches extend into the semiconductor substrate as recesses at positions between the oxide formed in the one or more first trenches (at 604).

At 608, one or more channel regions are formed by depositing germanium, silicon germanium, and/or a III-V semiconductor material in the one or more second trenches. In various embodiments, the III-V semiconductor material may be formed by combining a group III element (e.g., Al, Ga, and/or In) with a group V element (e.g., N, P, As, and/or Sb). In some embodiments, the resulting III-V semiconductor material may comprise gallium arsenide (GaAs), indium phosphide (InP), gallium phosphide (GaP), gallium arsenide phosphide (GaAsP), aluminum gallium arsenide (AlGaAs), or gallium nitride (GaN), for example.

At 610, a chemical mechanical polishing (CMP) process is performed using a CMP slurry comprising an oxidant and an etching inhibitor having a nitrogen-oxide compound. The nitrogen oxide compound may have a chemical formula of $R1R2R3N^+$—$O^-$, wherein R1 is a first substituent, R2 is a second substituent, and R3 is a third substituent. The etching inhibitor provides for a high germanium or III-V semiconductor material to oxide selectivity with a low rate recess formation in the germanium or the III-V semiconductor material.

At 612, a selective etch is performed to etch back the oxide to generate one or more three-dimensional fins comprising the channel regions.

At 614, source and drain regions are formed at opposite ends of the one or more channel regions.

At 616, one or more gate regions are formed above the channel regions at positions between the source and drain regions.

FIGS. 7A-7F illustrate cross-sectional views of some embodiments of an exemplary semiconductor substrate, whereon a method of forming a SiGe FinFET according to method 600 is implemented. Although FIGS. 7A-7F are described in relation to method 600, it will be appreciated that the structures disclosed in FIGS. 7A-7F are not limited to such a method. Rather, it will be appreciated that the illustrated structures of FIGS. 7A-7F provide for a structural description of a SiGe FinFET that is able to stand alone independent of a method.

Figure 7A:
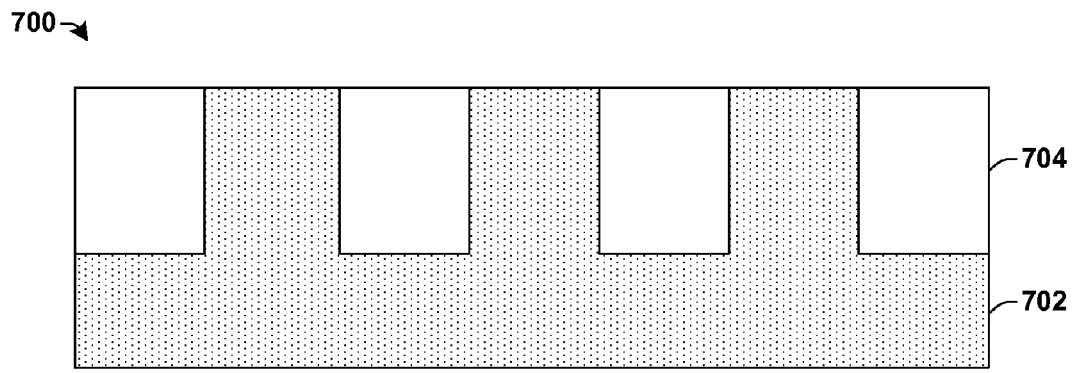
FIGS. 7A-7F illustrate cross-sectional views of some embodiments of an exemplary semiconductor substrate, whereon a method of forming a SiGe FinFET according to the method of FIG. 6 is implemented.

FIG. 7A illustrates some embodiments of a cross-sectional view 700 corresponding to 602-604. As shown in cross-sectional view 700, a semiconductor substrate 702 is selectively etched to form a first plurality of trenches. The first plurality of trenches extend from a top surface of the semiconductor substrate 702 to a position within the semiconductor substrate 702 and leave a plurality of silicon pillars extending out from the semiconductor substrate 702. An oxide 704 or other dielectric material is then formed within the plurality of trenches. In some embodiments, the oxide 704 may comprise silicon dioxide ($SiO_2$).

Figure 7B:
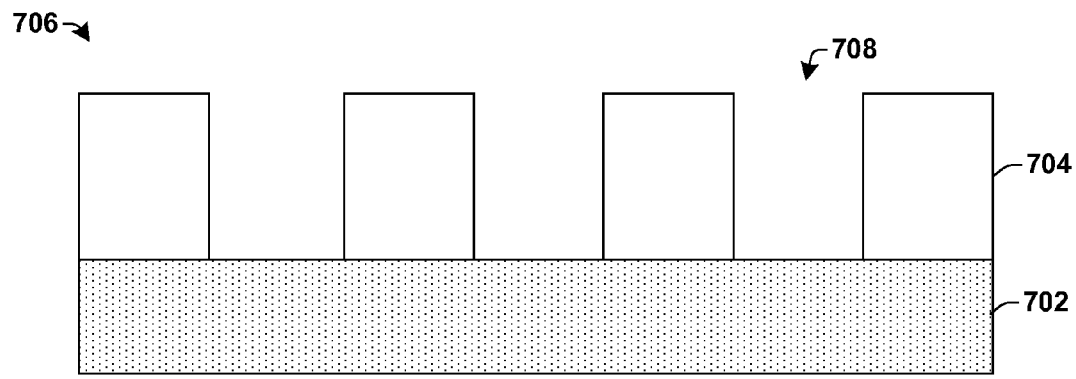

FIG. 7B illustrates some embodiments of a cross-sectional view 706 corresponding to 606. As shown in cross-sectional view 706, the semiconductor substrate 702 is selectively etched to remove silicon to form a second plurality of trenches 708.

Figure 7C:
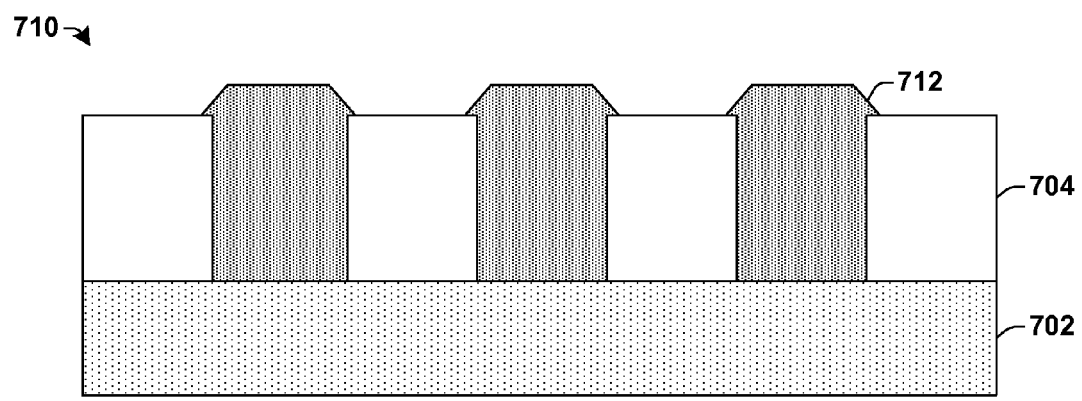

FIG. 7C illustrates some embodiments of a cross-sectional view 710 corresponding to 608. As shown in cross-sectional view 710, germanium and/or a III-V semiconductor material 712 is deposited in the second plurality of trenches 708 to form a plurality of channel regions.

Figure 7D:
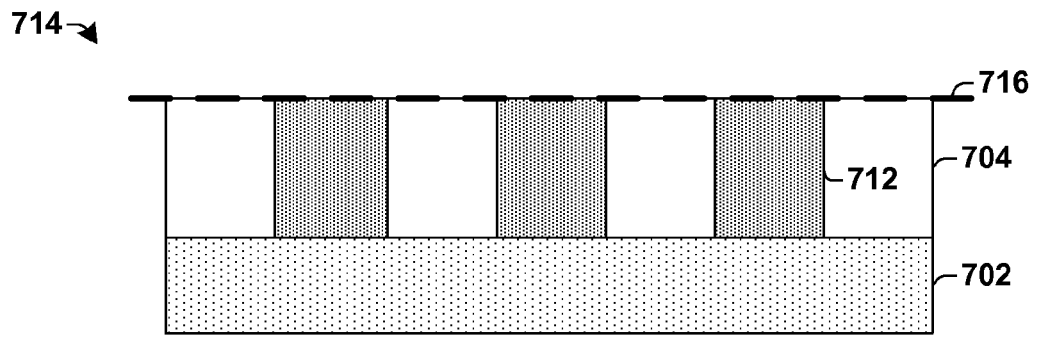

FIG. 7D illustrates some embodiments of a cross-sectional view 714 corresponding to 610. As shown in cross-sectional view 710, a chemical mechanical polishing (CMP) process is performed using a CMP slurry having a etching inhibitor that provides for a high germanium oxide selectivity with a low rate of recess formation in the germanium. The chemical mechanical polishing process removes excess material from the substrate. In some embodiments, the chemical mechanical polishing process forms a planar substrate along CMP line 716. Since the slurry provides for a high germanium oxide selectivity, germanium and/or the III-V semiconductor material 712 is removed from the semiconductor substrate at a higher rate than the oxide 704, resulting in a substantially flat surface on the top of the semiconductor substrate.

Figure 7E:
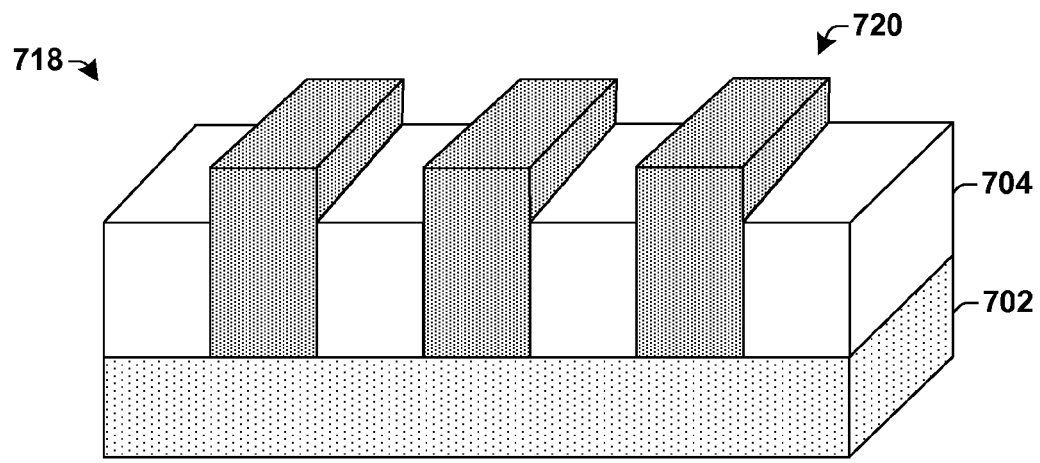

FIG. 7E illustrates some embodiments of a cross-sectional view 718 corresponding to 612. As shown in cross-sectional view 718, three-dimensional fins 720 are formed by selectively etching back the oxide 704. The three-dimensional fins comprise germanium and/or the III-V semiconductor material.

Figure 7F:
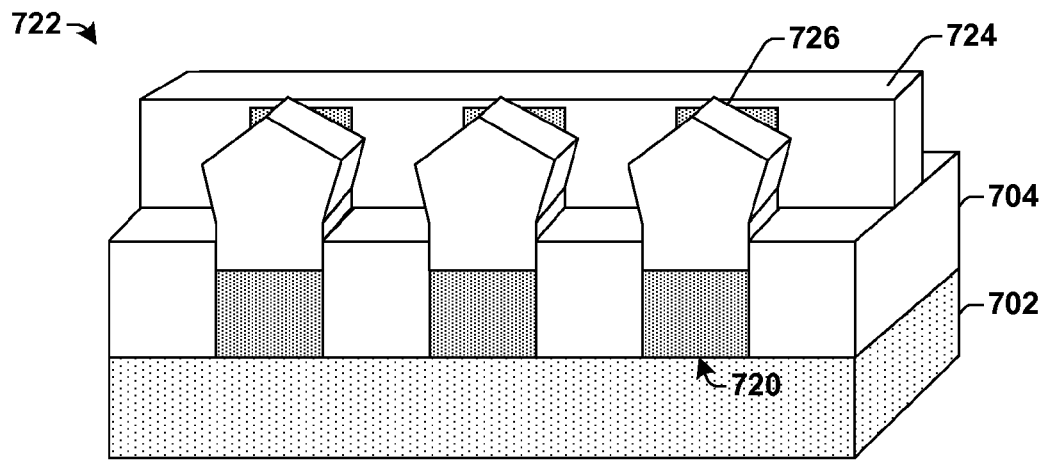

FIG. 7F illustrates some embodiments of a three-dimensional view 722 corresponding to 614-616. As shown in three-dimensional view 722, a gate region 724 is formed at a position overlying the three-dimensional fins 720. Source and drain regions 726 are formed within the three-dimensional fins 720 at opposite sides of the gate region 724. In some embodiments, the source and drain regions 726 may be formed by selectively etching the three-dimensional fins 720 to form source and drain recesses, and subsequently performing an epitaxial growth to form the source and drain regions 724 within the recesses. Although, FIG. 7F illustrates a FinFET device having two gates, it will be appreciated that in alternative embodiments, a disclosed finFET may be formed to have any number of gates.

FIG. 8 is a chart 800 showing the germanium to oxide selectivity of some embodiments of a disclosed slurry with an etching inhibitor. The first row of the chart 800 describes a first slurry composition that does not contain a nitrogen oxide etching inhibitor, such that comparison of rows 2-5 to the first row indicates the effect of the nitrogen-oxide etching inhibitor.

The first row of the chart 800 illustrates a first slurry composition without a nitrogen-oxide etching inhibitor. The first slurry composition consist of 2,000 ppm colloidal silica, 1,000 ppm $H_2O_2$, 200 ppm polyethylene glycol, and has a pH level of 3. The first slurry composition provides for a rate of germanium removal of approximately 2,200 angstroms/minute, and for a rate of oxide removal of approximately 80 angstroms/minute. Therefore, the resulting germanium to oxide selectivity is 27.5 and a germanium recess is formed having a depth of 835 angstroms.

The second row of the chart 800 illustrates a second slurry composition comprising a nitrogen-oxide etching inhibitor. The second slurry composition comprises 2,000 ppm colloidal silica, 1,000 ppm $H_2O_2$, 2,000 ppm 2-mercaptopyridine N-oxide, 200 ppm polyethylene glycol, and has a pH level of 3. The second slurry composition provides for a rate of germanium removal of approximately 1845 angstroms/minute, and for a rate of oxide removal of approximately 28 angstroms/minute. Therefore, the resulting germanium to oxide selectivity is 65 and a germanium recess is formed having a depth of 100 angstroms.

The third row of the chart 800 illustrates a third slurry composition comprising a nitrogen-oxide etching inhibitor. The third slurry composition comprises 2,000 ppm colloidal silica, 30,000 ppm ammonium peroxydisulfate, 5,000 ppm 4-methylpyridine N-oxide, 500 ppm polyethylene glycol, and has a pH level of 3. The third slurry composition provides for a rate of germanium removal of approximately 1,245 angstroms/minute, and for a rate of oxide removal of approximately 15 angstroms/minute. Therefore, the resulting germanium to oxide selectivity is 83 and a germanium recess is formed having a depth of 35 angstroms.

The fourth row of the chart 800 illustrates a fourth slurry composition comprising a nitrogen-oxide etching inhibitor. The fourth slurry composition comprises 2,000 ppm colloidal silica, 8,000 ppm tert-butyl hydrogen peroxide, 3,000 ppm N-methylmorpholine N-oxide, 500 ppm polyethylene glycol, and has a pH level of 6. The fourth slurry composition provides for a rate of germanium removal of approximately 1,856 angstroms/minute, and for a rate of oxide removal of approximately 21 angstroms/minute. Therefore, the resulting germanium to oxide selectivity is 88 and a germanium recess is formed having a depth of 48 angstroms.

The fifth row of the chart 800 illustrates a fifth slurry composition comprising a nitrogen-oxide etching inhibitor. The fifth slurry composition comprises 8,000 ppm tert-butyl hydrogen peroxide, 3,000 ppm N-methylmorpholine N-oxide, 500 ppm polyethylene glycol, and has a pH level of 10. The fifth slurry composition is free of abrasive particles. The fifth slurry composition provides for a rate of germanium removal of approximately 656 angstroms/minute, and for a rate of oxide removal of approximately 3 angstroms/minute. Therefore, the resulting germanium to oxide selectivity is 218 and a germanium recess is formed having a depth of 25 angstroms.

It will be appreciated that while reference is made throughout this document to exemplary structures in discussing aspects of methodologies described herein, those methodologies are not to be limited by the corresponding structures presented. Rather, the methodologies and structures are to be considered independent of one another and able to stand alone and be practiced without regard to any of the particular aspects depicted in the Figs.

Also, equivalent alterations and/or modifications may occur to one of ordinary skill in the art based upon a reading and/or understanding of the specification and annexed drawings. The disclosure herein includes all such modifications and alterations and is generally not intended to be limited thereby. For example, although the figures provided herein are illustrated and described to have a particular doping type, it will be appreciated that alternative doping types may be utilized as will be appreciated by one of ordinary skill in the art.

In addition, while a particular feature or aspect may have been disclosed with respect to one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ from that illustrated herein.

Therefore, the present disclosure relates to a chemical mechanical polishing (CMP) slurry composition that provides for a high metal to dielectric material selectivity along with a low rate of metal recess formation.

In some embodiments, the present disclosure relates to a chemical mechanical polishing (CMP) slurry composition configured to provide for a high metal to oxide removal selectivity with a low rate of metal recess formation. The CMP slurry composition comprises an oxidant having a compound having one or more oxygen molecules. The CMP slurry composition further comprises an etching inhibitor having nitrogen-oxide compound having a chemical formula of $R1R2R3N^+$—$O^-$, wherein $N^+$ comprises a nitrogen molecule, $O^-$ comprises an oxygen molecule, R1 is a first substituent, R2 is a second substituent, and R3 is a third substituent.

In other embodiments, the present disclosure relates to a chemical mechanical polishing (CMP) slurry composition. The CMP slurry composition comprises an oxidant comprising a compound having one or more oxygen molecules and an etching inhibitor configured to provide for a III-V semiconductor material to dielectric material removal selectivity greater than or equal to 30. The etching inhibitor comprises a nitrogen-oxide compound having a chemical formula of $R1R2R3N^+$—$O^-$, wherein $N^+$ comprises a nitrogen molecule, $O^-$ comprises an oxygen molecule, R1 comprises a first substituent having 1-20 carbon alkyl substituents disposed within a parent-chain, a side-chain, or as cyclic substituents, R2 comprises a second substituent having 1-20 carbon alkyl substituents disposed within a parent-chain, a side-chain, or as cyclic substituents, and R3 comprises a third substituent, having 0-10 carbon alkyl substituents disposed within a parent-chain, a side-chain, or as cyclic substituents.

What is claimed is:

1. A chemical mechanical polishing (CMP) slurry composition configured to provide for a high metal to dielectric material removal selectivity with a low rate of metal recess formation, consisting of:
   an oxidant comprising a peroxide;
   an etching inhibitor configured to reduce a removal rate of a metal relative to an oxide, so as to provide the CMP slurry composition with a metal-to-oxide etching selectivity of greater than or equal to approximately 60-to-1, wherein the etching inhibitor comprises a nitrogen-oxide compound having a chemical formula of $R1R2R3N^+$—$O^-$, wherein $N^+$ comprises a nitrogen molecule, $O^-$ comprises an oxygen molecule, R1 is a first substituent, R2 is a second substituent, and R3 is a third substituent;
   a solvent; and
   one or more abrasive particles.

2. The slurry composition of claim 1, wherein the etching inhibitor comprises 2,2,6,6-Tetramethylpiperidine-1-oxyl (TEMPO) and is configured to reduce a removal rate of silicon germanium relative to a removal rate of an oxide.

3. The slurry composition of claim 1, wherein the oxidant comprises a concentration having a range of between approximately 10 ppm and 50,000 ppm.

4. The slurry composition of claim 1,
   wherein the first substituent, R1, and the second substituent, R2, have 1-20 carbon alkyl substituents disposed as cyclic substituents; and
   wherein the third substituent, R3, has 0-10 carbon alkyl substituents disposed as cyclic substituents.

5. The slurry composition of claim 1, wherein the etching inhibitor comprises pyridine N-oxide, 4-methylpyridine N-oxide, N-methylmorpholine N-oxide, 5,5-dimethyl-1-pyrroline N-oxide, trimethylamine N-oxide, quinoline N-oxide, or 2-mercaptopyridine N-oxide.

6. The slurry composition of claim 1, wherein the etching inhibitor comprises a concentration having a range of between approximately 10 ppm and 50,000 ppm.

7. The slurry composition of claim 1, further comprising an abrasive including colloidal silica, fumed silica, aluminum oxide, or a silica shell based composite submicron particle.

8. The slurry composition of claim 1, wherein slurry composition comprises a pH level having a range of between approximately 1 and 10.

9. The slurry composition of claim 1, further comprising:
   a surfactant comprising having a concentration in a range of between approximately 200 ppm and approximately 500 ppm.

10. The slurry composition of claim 9, wherein the oxidant is ammonium peroxydisulfate, the etching inhibitor is 4-methylptridine N-oxide, and the surfactant is polyethylene glycol.

11. The slurry composition of claim 9, wherein the oxidant is tetr-butyl hydrogen peroxide, the etching inhibitor is N-methylmorpholine N-oxide, and the surfactant is polyethylene glycol.

12. The slurry composition of claim 11, wherein the slurry composition is devoid of abrasive particles.

13. A chemical mechanical polishing (CMP) slurry composition, consisting of:
   an oxidant comprising potassium peroxydisulfate, ammonium peroxydisulfate, sodium peroxydisulfate, potassium peroxymonosulfate, peracetic acid, or tert-butyl hydrogen peroxide;
   an etching inhibitor configured to reduce a removal rate of silicon germanium relative to an oxide, wherein the etching inhibitor consists of pyridine N-oxide, 4-methylpyridine N-oxide, N-methylmorpholine N-oxide, 5,5-dimethyl-1-pyrroline N-oxide, trimethylamine N-oxide, quinoline N-oxide, or 2-mercaptopyridine N-oxide; and de-ionized water.

14. The slurry composition of claim 13, further comprising:
a surfactant comprising having a concentration of between approximately 200 and 500 ppm.

15. The slurry composition of claim 14, wherein the oxidant is ammonium peroxydisulfate, the etching inhibitor is 4-methylptridine N-oxide, and the surfactant is polyethylene glycol.

16. The slurry composition of claim 14, wherein the oxidant is tetr-butyl hydrogen peroxide, the etching inhibitor is N-methylmorpholine N-oxide, and the surfactant is polyethylene glycol.

17. The slurry composition of claim 16, wherein the slurry composition is devoid of abrasive particles.

18. The slurry composition of claim 13, wherein the etching inhibitor comprises a concentration having a range of between approximately 10 ppm and 50,000 ppm.

19. The slurry composition of claim 13, further comprising an abrasive including one or more of: colloidal silica, fumed silica, aluminum oxide, and a silica shell based composite submicron particle.

20. A chemical mechanical polishing (CMP) slurry composition configured to provide for a high metal to dielectric material removal selectivity with a low rate of metal recess formation, consisting of:

an oxidant comprising a compound having one or more oxygen molecules; and an etching inhibitor configured to reduce a removal rate of silicon germanium relative to an oxide, wherein the etching inhibitor consists of pyridine N-oxide, 4-methylpyridine N-oxide, N-methylmorpholine N-oxide, 5,5-dimethyl-1-pyrroline N-oxide, trimethylamine N-oxide, quinoline N-oxide, or 2-mercaptopyridine N-oxide;

de-ionized water; and one or more abrasive particles.

* * * * *